US012781313B2

(12) United States Patent
Uno et al.

(10) Patent No.: US 12,781,313 B2
(45) Date of Patent: Nov. 3, 2026

(54) AI WIRING MATERIAL

(71) Applicants: NIPPON MICROMETAL CORPORATION, Saitama (JP); NIPPON STEEL Chemical & Material Co., Ltd., Tokyo (JP)

(72) Inventors: Tomohiro Uno, Tokyo (JP); Yuya Suto, Tokyo (JP); Tetsuya Oyamada, Tokyo (JP); Daizo Oda, Saitama (JP); Yuto Kurihara, Saitama (JP); Motoki Eto, Saitama (JP)

(73) Assignees: NIPPON MICROMETAL CORPORATION, Saitama (JP); NIPPON STEEL Chemical & Material Co., Ltd., Tokyo (JP)

( * ) Notice: Subject to any disclaimer, the term of this patent is extended or adjusted under 35 U.S.C. 154(b) by 587 days.

(21) Appl. No.: 18/275,599

(22) PCT Filed: Jan. 31, 2022

(86) PCT No.: PCT/JP2022/003584
§ 371 (c)(1),
(2) Date: Aug. 2, 2023

(87) PCT Pub. No.: WO2022/168789
PCT Pub. Date: Aug. 11, 2022

(65) Prior Publication Data

US 2024/0110262 A1 Apr. 4, 2024

(30) Foreign Application Priority Data

Feb. 5, 2021 (JP) ................................ 2021-017063

(51) Int. Cl.

| | |
|---|---|
| ***C22C 21/00*** | (2006.01) |
| ***C22C 1/02*** | (2006.01) |
| ***C22C 21/02*** | (2006.01) |
| ***C22C 21/08*** | (2006.01) |
| ***C22C 21/14*** | (2006.01) |
| ***C22C 21/16*** | (2006.01) |
| ***C22F 1/043*** | (2006.01) |
| ***C22F 1/047*** | (2006.01) |
| ***C22F 1/057*** | (2006.01) |
| ***H10W 72/50*** | (2026.01) |

(52) U.S. Cl.
CPC .............. *C22C 21/14* (2013.01); *C22C 1/026* (2013.01); *C22C 21/00* (2013.01); *C22C 21/02* (2013.01); *C22C 21/08* (2013.01); *C22C 21/16* (2013.01); *C22F 1/043* (2013.01); *C22F 1/047* (2013.01); *C22F 1/057* (2013.01); *H10W 72/5524* (2026.01)

(58) Field of Classification Search
None
See application file for complete search history.

(56) References Cited

U.S. PATENT DOCUMENTS

| | | | | |
|---|---|---|---|---|
| 4,845,543 | A | 7/1989 | Okikawa et al. | |
| 9,397,064 | B2 | 7/2016 | Milke et al. | |
| 2013/0126051 | A1 * | 5/2013 | Sekiya .................... | C22F 1/043 148/439 |
| 2020/0040432 | A1 | 2/2020 | Kaneko | |
| 2022/0152749 | A1 | 5/2022 | Yamada et al. | |

FOREIGN PATENT DOCUMENTS

| | | | | |
|---|---|---|---|---|
| CN | 104164591 | A | 11/2014 | |
| CN | 110475885 | A | 11/2019 | |
| JP | S5956737 | A * | 4/1984 | ............. H01L 24/45 |
| JP | 60-95948 | A | 5/1985 | |
| JP | S60095949 | A | 5/1985 | |
| JP | S60095954 | A | 5/1985 | |
| JP | 60-177667 | A | 9/1985 | |
| JP | S61-032444 | A | 2/1986 | |
| JP | 2002-314038 | A | 10/2002 | |
| JP | 2008-311383 | A | 12/2008 | |
| JP | 2014-129578 | A | 7/2014 | |
| JP | 2014224283 | A * | 12/2014 | ............. C22C 21/00 |
| JP | 2016-511529 | A | 4/2016 | |
| JP | 2016-152316 | A | 8/2016 | |
| JP | 2020-059882 | A | 4/2020 | |
| JP | 2020-059886 | A | 4/2020 | |
| SG | 10201402300 | T | 12/2014 | |
| WO | 2020/184655 | A1 | 9/2020 | |

OTHER PUBLICATIONS

Hirsch, Jurgen, "Annealing of Aluminum and Its Alloys", ASM Handbook vol. 4E, Asm International, p. 137-147. (Year: 2016).*
Office Action dated Jul. 9, 2025, from corresponding Taiwanese Application No. 111103590.
International Search Report issued in corresponding International Patent Application No. PCT/JP2022/003584, dated Mar. 29, 2022, with English translation.
Extended European search report dated Sep. 29, 2025 issued in the corresponding European patent application No. 22749661.9.
Official Action dated Nov. 21, 2025 issued in the corresponding Singapore patent application No. 11202305824T.
Sato, Shiro and Takashi Endo. "Relation between tensile strength and hardness of aluminum alloys." Journal of Japan Institute of Light Metals vol. 36, Issue 1 (1986): 29-35.

* cited by examiner

*Primary Examiner* — Keith D. Hendricks
*Assistant Examiner* — Janell C Morillo
(74) *Attorney, Agent, or Firm* — Rimon P.C.

(57) ABSTRACT

There is provided an Al wiring material which can achieve sufficient bond reliability of bonded parts in a high-temperature environment at the time when a semiconductor device operates. The Al wiring material containing one or more of Pd and Pt so as to satisfy $$3 \leq x1a \leq 90 \text{ or } 10 \leq x1b \leq 250, \text{ and}$$

$$3 \leq (x1a + x1b) \leq 300,$$

where x1a and x1b are respectively a content of Pd [mass ppm] and a content of Pt [mass ppm],
with the balance comprising Al, and
an average crystal grain diameter on a cross-section perpendicular to a longitudinal direction of the Al wiring material is 3 to 35 μm.

7 Claims, No Drawings

Al WIRING MATERIAL

CROSS-REFERENCE OF RELATED APPLICATIONS

This application is the U.S. National Phase under 35 U.S.C. § 371 of International Patent Application No. PCT/JP2022/003584, filed on Jan. 31, 2022, which in turn claims the benefit of Japanese Patent Application No. 2021-017063, filed on Feb. 5, 2021, the entire disclosures of which Applications are incorporated by reference herein.

TECHNICAL FIELD

The present invention relates to an Al wiring material. The present invention further relates to a semiconductor device including the Al wiring material.

BACKGROUND ART

As for a linear material used for electrical connection and mechanical connection in industrial devices and electronic parts, the use of aluminum (Al) is increasing with a demand of computerization of automobiles since aluminum is more lightweight and inexpensive than copper (Cu) which has been conventionally used. For an Al wire (circle) and an Al strip (flat or ellipse) used for industrial devices such as a conveying device and a robot, there are required mechanical properties such as a breaking strength and an elongation, an electrical conductivity, a thermal conductivity, and the like depending on the purposes of use.

In a semiconductor device, electrodes formed on a semiconductor chip are connected with a lead frame or electrodes on a substrate via a bonding wire or a bonding ribbon. In a power semiconductor device, Al is mainly used as a material of the bonding wire or the bonding ribbon. For example, Patent Literature 1 discloses an example of using an Al bonding wire with a diameter of 300 μm in a power semiconductor module. In the power semiconductor device using the Al bonding wire or Al bonding ribbon, wedge bonding is used as a bonding process for both of first connection with electrodes on a semiconductor chip and second connection with the lead frame or electrodes on a substrate.

Hereinafter, the above-described Al wire, Al strip, Al bonding wire, Al bonding ribbon, and the like are collectively referred to as an Al wiring material.

Power semiconductor devices using Al wiring materials are often used as control devices for automobiles, and electronic devices such as air conditioners and photovoltaic power generation systems. In these semiconductor devices, a bonded part between the wiring material and a member to be connected is exposed to a high temperature during operation of the devices. Further, when the semiconductor devices operate by switching high voltage on and off at high speed, it is exposed to a severe environment where the temperature is repetitively increased and decreased. When using a material composed only of high purity Al as the wiring material, softening of the wiring material tends to proceed in such a temperature environment at the time when the device operates, and it is difficult to use such wiring material in a high-temperature environment.

There has been developed an Al wiring material made of a material obtained by adding a specific element to Al. For example, Patent Literature 2 discloses an Al bonding wire the mechanical strength of which is improved by adding scandium (Sc) of 0.05 to 1% by weight to Al to be precipitation-hardened. Patent Literature 3 discloses that an Al wiring material containing one or more of nickel (Ni), silicon (Si), and phosphorus (P), the amount of which is 800 weight ppm or less in total, has a favorable bonding strength and weather resistance. Patent Literature 4 discloses an Al bonding wire containing 0.01 to 0.2% by weight of iron (Fe) and 1 to 20 weight ppm of Si in which a solid solution amount of Fe is 0.01 to 0.06% by weight, a precipitation amount of Fe is seven times or less the solid solution amount, and an average crystal grain diameter is 6 to 12 μm, and describes that this wire has a favorable bond reliability.

RELATED ART REFERENCE

Patent Literature

Patent Literature 1: JP-A-2002-314038
Patent Literature 2: JP-A-2016-511529
Patent Literature 3: JP-A-2016-152316
Patent Literature 4: JP-A-2014-129578

SUMMARY OF INVENTION

Problem to be Solved by the Invention

With enhancement of functions of industrial devices and electronic parts and with expansion of application thereof, a requirement for Al wiring materials used therefor becomes higher. For Al wiring materials used for electronic parts of a semiconductor device and the like, there is a severe requirement to bond a plurality of small-diameter Al wiring materials to the same electrode part to achieve both of downsizing and higher output of the semiconductor device. On the other hand, for use as a high-output power device, alternative use for reducing the weight of a Cu wiring material, and the like, a large-diameter Al wiring material is used. In bonding of a large-diameter Al wiring material, deformation thereof and variation in the bonding often become a problem. Al, nickel palladium (Ni—Pd), Cu, and the like are mainly used as a material of an electrode on a semiconductor chip, and it has been often difficult to secure a strength of a bonded interface when a film thickness of the electrode part is increased. To adapt to various wire diameters of Al wiring materials, the material or film thickness of the electrode, and the like, it is required to improve bondability thereof.

Owing to expansion of application of automotive power devices, for an Al wiring material, it is required to improve initial bondability and bond reliability of the bonded part in a high-temperature environment. In semiconductor devices, it is important that the Al wiring material is bonded to an electrode on a semiconductor chip, and a bonding strength of the bonded part between the Al wiring material and the electrode is enhanced. To evaluate the bonding strength of the bonded part between the Al wiring material and the electrode, a bonding strength measured by a shear test in which the bonded part is broken by shearing (hereinafter, referred to as a "shear force") is typically used. Although a high shear force is desirable, it has been confirmed that a peeling defect may be caused in a high-temperature environment and bond reliability may be deteriorated even when the shear force is high. The shear force measured by breaking the bonded part by shearing is effective as an indicator of an apparent bonding strength, but as for the bonded part of the Al wiring material having a relatively large bonding area, it is difficult to correctly grasp a state of the bonded interface thereof based on the shear force.

As described above, regarding the bondability of the Al wiring material, a peeling defect may be caused in a high-temperature environment and bond reliability may be deteriorated only by enhancing the shear force as a normal standard. For example, it is known that a bonded part exhibiting a high shear force can be obtained by adding Ni to an Al wiring material (Patent Literature 3). Even in such a technique, a peeling defect may be caused in a high-temperature environment and bond reliability may be deteriorated.

Thus, as a result of examining a relation between bonding behavior and the peeling defect, the present inventors have found that one of the causes of the peeling defect is that an insufficiently bonded region is present on an interface of the bonded part. That is, the present inventors have found that, in a case in which the peeling defect is caused, when observing a broken surface on the electrode side after the shear test, a generation frequency of an unbonded region in which metallic junction is not obtained (hereinafter, referred to as a "void") is high in part of the bonded part. Increase of voids in the bonded part lowers productivity, and additionally causes a defect such that a crack is caused from the unbonded region as a starting point due to a temperature change during operation of the semiconductor device, and the bonded part peels off when the defect further proceeds. In this regard, there is a method of increasing loads and ultrasonic outputs applied at the time of bonding to reduce voids generated at the time of bonding. However, in such a method, there arise a problem that a damage such as a crack is caused on the semiconductor chip (hereinafter, referred to as "chip damage").

Furthermore, it has become difficult to achieve or improve bond reliability of the bonded part for a long time in a high-temperature environment required for high-temperature power devices such as SiC. A power cycle test is performed as one of the methods for evaluating the bond reliability of the bonded part in a high-temperature environment. This test repeats rapid heating and cooling by turning the voltage on and off repeatedly. Due to repeated rapid heating and cooling, there arise problems that the bonding strength of the bonded part of the Al wiring material is reduced, and a defect such as a crack or peeling off is caused in the vicinity of the bonded interface. For example, with regard to the endurance in the power cycle test, under a severe condition exceeding 10000 cycles, generation of a defect such as a crack or peeling off at the bonded part of the Al wiring material hinders practical implementation of the power device.

As described above, with regard to the bondability of the Al wiring material, reducing voids at the time of bonding and improving the bond reliability of the bonded part in a high-temperature environment in addition to increasing the shear force are advantageous for enhancing functions, quality, reliability, and the like of automotive power devices and the like.

An object of the present invention is to provide an Al wiring material that achieves a sufficient bond reliability of a bonded part in a high-temperature environment at the time when a semiconductor device operates.

Means for Solving Problem

As a result of earnest investigation as to the problem described above, the present inventors have found that the problem described above can be solved by the Al wiring material having the configuration described below, and further investigated the problem based on such knowledge to complete the present invention.

That is, the summary of the present invention is as follows.

[1] An Al wiring material containing one or more of Pd and Pt so as to satisfy $$3 \leq x1a \leq 90 \text{ or } 10 \leq x1b \leq 250, \text{ and}$$

$$3 \leq (x1a + x1b) \leq 300,$$

where x1a and x1b are respectively a content of Pd [mass ppm] and a content of Pt [mass ppm], with the balance comprising Al, and an average crystal grain diameter on a cross-section perpendicular to a longitudinal direction of the Al wiring material is 3 to 35 μm.

[2] The Al wiring material according to [1], wherein, on the cross-section perpendicular to the longitudinal direction of the Al wiring material, an orientation ratio of a crystal orientation <111> angled at 15 degrees or less to the longitudinal direction of the Al wiring material is equal to or higher than 0.5% and equal to or lower than 35%.

[3] The Al wiring material according to [1] or [2], wherein a tensile strength is equal to or larger than 25 MPa and equal to or smaller than 95 MPa.

[4] The Al wiring material according to any one of [1] to [3], further containing one or more of Mg, Mn, and Cu so as to satisfy $$200 \leq x2 \leq 6000$$

where x2 is a total content thereof [mass ppm].

[5] The Al wiring material according to any one of [1] to [4], further containing one or more of Fe, Si, and Ni so as to satisfy $$10 \leq x3 \leq 2000$$

where x3 is a total content thereof [weight ppm].

[6] The Al wiring material according to any one of [1] to [5], wherein a content of Al is equal to or larger than 98% by mass.

[7] The Al wiring material according to any one of [1] to [6], wherein a balance of the Al bonding wire comprises Al and inevitable impurities.

[8] A semiconductor device comprising the Al wiring material according to any one of [1] to [7].

Effect of the Invention

The present invention provides an Al wiring material with which bond reliability of a bonded part can be sufficiently obtained under a high-temperature environment at the time when the semiconductor device operates.

EMBODIMENT FOR CARRYING OUT THE INVENTION

Hereinafter, the present invention will be described in detail with reference to preferable embodiments thereof. However, the present invention is not limited to the following embodiments and examples, and may be optionally changed to be implemented without departing from CLAIMS of the present invention and equivalents thereof.

[Al Wiring Material]

The Al wiring material of the present invention contains one or more of Pd and Pt so as to satisfy $3 \leq x1a \leq 90$ or $10 \leq x1b \leq 250$, and $3 \leq (x1a+x1b) \leq 300$, where x1a and x1b are respectively a content of Pd [mass ppm] and a content of Pt

[mass ppm], with the balance comprising Al, and an average crystal grain diameter on a cross-section perpendicular to a longitudinal direction of the Al wiring material is 3 to 35 μm.

As described above, the Al wiring material is required to achieve both of reduction of a chip damage and improvement in the bond quality immediately after bonding (hereinafter, referred to as "initial bonding"), and improve the bond reliability of the bonded part in a high-temperature environment (hereinafter, also referred to as "high-temperature reliability of the bonded part") at the time when the semiconductor device operates after bonding, at the same time. Regarding the bond quality, it is important to reduce the unbonded region ("void") at the bonded part in addition to increasing the shear force.

With the Al wiring material of the present invention containing a predetermined amount of one or more of Pd and Pt (hereinafter, also referred to as a "first group element") in which the average crystal grain diameter falls within a specific range, favorable bonding can be obtained for the entire bonded interface while suppressing generation of the unbonded region at the bonded interface by accelerating diffusion on the bonded interface at the time of applying loads and ultrasonic waves to bond the Al wiring material to the electrode. By reducing the unbonded region, an area ratio of a region directly contributing to bonding in which metallic bonding is obtained to an area of the bonded interface (hereinafter, referred to as a "bonding effective area ratio" or "Effective Bonded area Ratio (EBR)") can be increased. A bonding effective area used for a test calculation of the bonding effective area ratio (EBR) can be easily calculated as a region obtained by excluding the unbonded region from the bonded interface region. The present inventors have found that a high effect of improving the high-temperature reliability of the bonded part can be obtained by increasing the EBR.

That is, by causing the content of the first group element and the crystal grain diameter in the Al wiring material to fall within the range of the present invention, a high effect of improving the EBR can be obtained. By improving the bondability in the initial bonding due to improvement of the EBR, the high-temperature reliability of the bonded part can be enhanced as a result.

An effect of containing a predetermined amount of the first group element is considered such that growth of an Al oxide film on a surface of the Al wiring material is suppressed, the Al oxide film can be easily broken due to ultrasonic vibrations at the time of bonding even if the Al oxide film is formed, and diffusion of Al from the Al wiring material to the electrode side is accelerated. An effect of causing the crystal grain diameter of the Al wiring material to fall within the specific range is considered such that a grain boundary as resistance to deformation at the time of bonding is reduced, and efficiency of transmission of ultrasonic waves to the bonded interface is enhanced, so that breakdown of oxide films of the Al wiring material and the electrode is accelerated. With the Al wiring material of the present invention, the effect of containing the predetermined amount of the first group element and the effect of causing the crystal grain diameter to fall within the specific range are synergistically exhibited, and the high-temperature reliability of the bonded part can be significantly improved.

By combining containing of the first group element and control of the average crystal grain diameter at the cross-section perpendicular to the longitudinal direction of the Al wiring material (hereinafter, referred to as a "C cross-section") to obtain a high synergistic effect, the EBR can be easily increased to improve the bondability in the initial bonding. It has been confirmed that, even with the Al wiring material containing the first group element, in a case in which the average crystal grain diameter at the C cross-section is smaller than the predetermined range of the present application, the oxide film is not sufficiently broken at the time of bonding, and the effect of improving the EBR is small. It has been confirmed that, even with the Al wiring material in which the crystal grain diameter is large and a tensile strength is low, the area of the bonded interface can be increased but the unbonded region is left when the Al wiring material is made of high-purity Al as a material or contains Ni as in the related art, so that the effect of improving the EBR is small.

To exhibit the effect of the first group element, it is important to control the average crystal grain diameter at the C cross-section of the Al wiring material. At the time of bonding of the Al wiring material, by applying loads and ultrasonic vibrations to the Al wiring material by a capillary, the C cross-section having a circular shape is largely deformed, and the shape thereof is changed to be an elliptic shape, a trapezoidal shape, a triangular shape, and the like after the bonding. In a process of change of the shape, bonding with the electrode proceeds. The present inventors have found that the average crystal grain diameter at the C cross-section is related to a shape change of the C cross-section and the EBR. That is, to exhibit the effect of the present invention, it is more important to control a combination of the average crystal grain diameter at the C cross-section and containing of the first group element than controlling the crystal grain diameter and a structure at the cross-section parallel with the longitudinal direction of the Al wiring material.

As described above, with the Al wiring material, a significant effect of increasing the EBR can be obtained by controlling containing of the first group element and the crystal grain diameter at the C cross-section at the same time. Due to this, the EBR can be increased even in a case of bonding the Al wiring material at the ordinary temperature, and a resin substrate or the like that is sensitive to heat can be used. Alternatively, it is advantageous that the EBR can be increased even in a case of reducing loads and ultrasonic outputs to be applied at the time of bonding, and a yield and productivity can be increased even in a case of using a semiconductor chip on which a chip damage is easily caused, for example, a semiconductor chip including a thin electrode film, and the like.

The EBR at the bonded part with respect to the electrode on the semiconductor chip is obtained as a ratio of an area M2 in which metallic junction is obtained to an area M1 of the bonded interface (M2/M1). For example, the EBR at the bonded part between the Al wiring material and the electrode on the semiconductor chip can be obtained through the following procedure. First, a shear test for the bonded part is performed, and a fractured electrode to be bonded is observed with an optical microscope or an SEM. The area M1 of the bonded interface and an area M3 of the unbonded region are then obtained by image analysis, the unbonded region in which it is determined that the electrode is deformed but metallic junction is not obtained at the time of bonding, and the area M2 (=M1−M3) in which metallic junction is obtained is calculated. An EBR value can be calculated as a ratio of M2 to M1 (M2/M1), and specifically, a computational expression thereof is EBR=M2/M1=(M1−M3)/M1.

The Al wiring material of the present invention contains one or more of Pd and Pt as the first group element so as to $3 \leq x1a \leq 90$ or $10 \leq x1b \leq 250$, and $3 \leq (x1a+x1b) \leq 300$, where x1a and x1b are respectively a content of Pd [mass ppm] and a content of Pt [mass ppm]. The following describes preferred ranges of x1a and x1b, but as long as a total value thereof, that is, (x1a+x1b), falls within the predetermined range described above, only the preferred range of the x1a may be satisfied, only the preferred range of x1b may be satisfied, or both of the preferred range of x1a and the preferred range of x1b may be satisfied.

From the viewpoint of increasing the EBR and improving the high-temperature reliability of the bonded part by extension, the content of Pd in the Al wiring material, that is, x1a, is equal to or larger than 3 mass ppm. When x1a is smaller than 3 mass ppm, the effect of increasing the EBR, and by extension, the effect of improving the high-temperature reliability of the bonded part are insufficient. x1a is preferably equal to or larger than 4 mass ppm, equal to or larger than 5 mass ppm, or equal to or larger than 6 mass ppm, and more preferably larger than 6 mass ppm, equal to or larger than 8 mass ppm, equal to or larger than 10 mass ppm, equal to or larger than 15 mass ppm, or equal to or larger than 20 mass ppm. When x1a exceeds 6 mass ppm under the condition that a value of (x1a+x1b) falls within the range of the present invention in relation to x1b, an effect of further increasing the EBR can be obtained.

From the viewpoint of uniformly deforming the Al wiring material at the time of bonding to improve the high-temperature reliability of the bonded part, x1a is equal to or smaller than 90 mass ppm. When x1a exceeds 90 mass ppm, the Al wiring material is ununiformly deformed at the time of bonding, and the EBR tends to be reduced. x1a is preferably equal to or smaller than 85 mass ppm, equal to or smaller than 80 mass ppm, equal to or smaller than 75 mass ppm, or equal to or smaller than 70 mass ppm, and more preferably smaller than 70 mass ppm, equal to or smaller than 68 mass ppm, equal to or smaller than 66 mass ppm, or equal to or smaller than 65 mass ppm. When x1a is smaller than 70 mass ppm under the condition that the value of (x1a+x1b) falls within the range of the present invention in relation to x1b, the effect of further increasing the EBR can be obtained.

Accordingly, in a preferred embodiment, the content of Pd in the Al wiring material, that is, x1a satisfies $3 \le x1a \le 90$, and more preferably satisfies $6 < x1a < 70$.

From the viewpoint of increasing the EBR and improving the high-temperature reliability of the bonded part by extension, the content of Pt in the Al wiring material, that is, x1b, is equal to or larger than 10 mass ppm. When x1b is smaller than 10 mass ppm, the effect of increasing the EBR, and by extension, the effect of improving the high-temperature reliability of the bonded part are insufficient. x1b is preferably equal to or larger than 12 mass ppm, equal to or larger than 14 mass ppm, equal to or larger than 16 mass ppm, equal to or larger than 18 mass ppm, or equal to or larger than 20 mass ppm, and more preferably larger than 20 mass ppm, equal to or larger than 25 mass ppm, equal to or larger than 30 mass ppm, equal to or larger than 35 mass ppm, or equal to or larger than 40 mass ppm. When x1b exceeds 20 mass ppm under the condition that the value of (x1a+x1b) falls within the range of the present invention in relation to x1a, an effect of further increasing the EBR can be obtained.

From the viewpoint of uniformly deforming the Al wiring material at the time of bonding to improve the high-temperature reliability of the bonded part, x1b is equal to or smaller than 250 mass ppm. Then x1b exceeds 250 mass ppm, the Al wiring material is ununiformly deformed at the time of bonding, and the EBR tends to be reduced. x1b is preferably equal to or smaller than 240 mass ppm, equal to or smaller than 230 mass ppm, equal to or smaller than 220 mass ppm, equal to or smaller than 210 mass ppm, or equal to or smaller than 200 mass ppm, and more preferably smaller than 200 mass ppm, equal to or smaller than 190 mass ppm, equal to or smaller than 180 mass ppm, equal to or smaller than 160 mass ppm, or equal to or smaller than 150 mass ppm. When x1b is smaller than 200 mass ppm under the condition that the value of (x1a+x1b) falls within the range of the present invention in relation to x1a, the effect of further increasing the EBR can be obtained.

Accordingly, in a preferred embodiment, the content of Pt in the Al wiring material, that is, x1b satisfies $10 \le x1b \le 250$, and more preferably satisfies $20 < x1b < 200$.

From the viewpoint of increasing the EBR and improving the high-temperature reliability of the bonded part by extension, a total content of Pd and Pt in the Al wiring material, that is, (x1a+x1b), is equal to or larger than 3 mass ppm. When (x1a+x1b) is smaller than 3 mass ppm, the effect of increasing the EBR, and by extension, the effect of improving the high-temperature reliability of the bonded part are insufficient. (x1a+x1b) is preferably equal to or larger than 5 mass ppm, or equal to or larger than 6 mass ppm, and more preferably larger than 6 mass ppm, equal to or larger than 8 mass ppm, equal to or larger than 10 mass ppm, equal to or larger than 15 mass ppm, or equal to or larger than 20 mass ppm. An upper limit of (x1a+x1b) is, under the condition that x1a and x1b satisfy the range described above, equal to or smaller than 300 mass ppm, preferably equal to or smaller than 290 mass ppm, equal to or smaller than 280 mass ppm, or equal to or smaller than 270 mass ppm, and more preferably smaller than 270 mass ppm, equal to or smaller than 260 mass ppm, or equal to or smaller than 250 mass ppm.

It has been confirmed that Pd exhibits a higher effect of accelerating breakdown, diffusion, or the like of the oxide film at the bonded interface as compared with Pt. As a result, it has been confirmed that the preferred range of the content x1a of Pd is lower than the preferred range of the content x1b of Pt in increasing the EBR. It is estimated that, when the content x1a of Pd exceeds 90 mass ppm, variation tends to be caused in the oxide film, the structure, and the like on the surface of the Al wiring material to cause ununiform deformation, and as a result, the EBR is reduced.

In the Al wiring material of the present invention, the average crystal grain diameter at the C cross-section of the Al wiring material is 3 to 35 μm. When the average crystal grain diameter is smaller than 3 μm, the unbonded region tends to be increased at the time of bonding, and the effect of increasing the EBR is small. The average crystal grain diameter at the C cross-section is preferably equal to or larger than 3.5 μm, equal to or larger than 4 μm, equal to or larger than 4.5 μm, equal to or larger than 5 μm, equal to or larger than 6 μm, or equal to or larger than 7 μm, and more preferably equal to or larger than 8 μm, equal to or larger than 8.5 μm, or equal to or larger than 9 μm. On the other hand, it has been confirmed that, when the average crystal grain diameter at the C cross-section exceeds 35 μm, a bonding shape and an area become unstable due to abnormal deformation of coarse crystal grains and the like, so that the EBR is reduced. An upper limit of the average crystal grain diameter is preferably equal to or smaller than 34 μm, equal to or smaller than 33 μm, equal to or smaller than 32 μm, or equal to or smaller than 31 μm, and more preferably equal to or smaller than 30 μm, equal to or smaller than 28 μm, equal to or smaller than 26 μm, or equal to or smaller than 25 μm. When the average crystal grain diameter at the C cross-section falls within a range from 8 to 30 μm, the Al wiring material can be easily stably manufactured at the time of mass production.

Accordingly, in a preferred embodiment, the average crystal grain diameter at the C cross-section of the Al wiring material is 3 to 35 μm, and more preferably 8 to 30 μm.

In manufacturing the Al wiring material, when thermal refining heat treatment is performed in the middle of wire-drawing process and in the vicinity of a final wire diameter, the average crystal grain diameter at the C cross-section of the Al wiring material tends to be easily caused to fall within the preferred range.

In the present invention, the average crystal grain diameter at the C cross-section of the Al wiring material is obtained by obtaining a circle equivalent diameter of each crystal grain using an Electron BackScattered Diffraction (EBSD) method, and arithmetically averaging the circle equivalent diameters. In the present invention, the average crystal grain diameter at the C cross-section is assumed to be an arithmetic mean value of respective values obtained by measuring C cross-sections at five or more points. In selecting a measurement surface (C cross-section), it is preferable to ensure objectivity of measurement data by acquiring five or more samples for measurement from the Al wiring material as a measurement target at intervals of 1 m or more with respect to the longitudinal direction of the Al wiring material, for example.

—Orientation Ratio of <111> Crystal Orientation—

In the Al wiring material of the present invention, by causing an orientation ratio of a <111> crystal orientation on the cross-section (C cross-section) perpendicular to the longitudinal direction of the Al wiring material to fall within a specific range, the EBR can be further increased.

Specifically, as a result of measuring the crystal orientation for the C cross-section of the Al wiring material, among crystal orientations in the longitudinal direction of the Al wiring material, the orientation ratio of the <111> crystal orientation having an angle difference with respect to the longitudinal direction of the Al wiring material equal to or smaller than 15° is preferably 0.5 to 35%. The EBR can be further increased by structure control for suppressing the orientation ratio of the <111> crystal orientation to be low, and particularly, a high effect of improving the EBR can be obtained even with a large-diameter Al wiring material.

The orientation ratio of the <111> crystal orientation can be measured by using the EBSD method. A device used for the EBSD method is configured by a scanning electron microscope and a detector mounted thereon. The EBSD method is a method for determining the crystal orientation at each measurement point by projecting, on the detector, a diffraction pattern of a reflected electron that is generated when an electron beam is emitted to a sample, and analyzing the diffraction pattern. For analysis of data obtained by the EBSD method, dedicated software (OIM analysis and the like manufactured by TSL solutions) can be used. An orientation ratio of a specific crystal orientation can be calculated by using analysis software attached to the device assuming that the C cross-section of the Al wiring material is an inspection surface.

In the present invention, the orientation ratio of the <111> crystal orientation is defined as an area ratio of the <111> crystal orientation assuming that a measurement area is a population. In calculating the orientation ratio, the orientation ratio of the <111> crystal orientation is assumed to be an area ratio of the <111> crystal orientation that is calculated assuming that an area of only the crystal orientation identified based on certain reliability was a population in a measurement area. In a process of obtaining the orientation ratio, calculation was performed excluding a part in which the crystal orientation cannot be measured, a part in which the crystal orientation can be measured but reliability of orientation analysis is low, or the like.

In the present invention, the orientation ratio of the <111> crystal orientation at the C cross-section was assumed to be an arithmetic mean value of respective values of the orientation ratios obtained by measuring C cross-sections at five or more points. In selecting the measurement surface (C cross-section), as described above, it is preferable to ensure objectivity of measurement data by acquiring, from the Al wiring material as a measurement target, a sample for measurement at intervals of 1 m or more with respect to the longitudinal direction of the Al wiring material, for example.

As the wire diameter of the Al wiring material increases, loads and ultrasonic waves to be applied at the time of bonding are more difficult to be transmitted to a center part of the bonded interface, and an area of the unbonded region (void) tends to be increased. From this viewpoint, by reducing the orientation ratio of the <111> crystal orientation, transmission efficiency of ultrasonic vibrations is improved even with a large-diameter Al wiring material, and the EBR can be increased. This effect of the crystal orientation can be further obtained in a case in which the wire diameter is equal to or larger than 250 μm, and even further obtained in a case in which the wire diameter is equal to or larger than 300 μm or equal to or larger than 350 μm.

At the C cross-section of the Al wiring material, the orientation ratio of the <111> crystal orientation angled at 15 degrees or less to the longitudinal direction of the Al wiring material is preferably equal to or higher than 0.5% and equal to or lower than 35%. Herein, when the orientation ratio of the <111> crystal orientation exceeds 35%, the effect of increasing the EBR tends to be reduced in a case in which the Al wiring material has a large diameter. The orientation ratio of the <111> crystal orientation is preferably lower than 35%, equal to or lower than 34%, equal to or lower than 32%, or equal to or lower than 30%, and more preferably lower than 30%, equal to or lower than 28%, equal to or lower than 26%, equal to or lower than 24%, equal to or lower than 22%, or equal to or lower than 20%. On the other hand, it is difficult to stably control the orientation ratio of the <111> crystal orientation to be lower than 0.5%. A lower limit of the orientation ratio of the <111> crystal orientation is preferably equal to or higher than 0.6%, equal to or higher than 0.8%, equal to or higher than 1%, equal to or higher than 1.5%, equal to or higher than 2%, or equal to or higher than 2.5%, and more preferably equal to or higher than 3%, equal to or higher than 3.5%, or equal to or higher than 4%. When the orientation ratio of the <111> crystal orientation is equal to or higher than 3% and lower than 30%, the effect of increasing the EBR can be further improved.

Accordingly, in a preferred embodiment, at the C cross-section of the Al wiring material, the orientation ratio of the <111> crystal orientation angled at 15 degrees or less to the longitudinal direction of the Al wiring material is preferably equal to or higher than 0.5% and equal to or lower than 35%, and more preferably equal to or higher than 3% and lower than 30%.

—Tensile Strength—

In the Al wiring material of the present invention, the tensile strength is preferably falls within a range equal to or larger than 25 MPa and equal to or smaller than 95 MPa. In the Al wiring material of the present invention containing the predetermined amount of the first group element in which the average crystal grain diameter at the C cross-section falls within the specific range, the high-temperature reliability of the bonded part can be further improved by causing the tensile strength to fall within the preferred range described above.

The high-temperature reliability can be evaluated by examining changes in the bonding strength or an electrical characteristic of the Al wiring material after performing the power cycle test. By using the Al wiring material of the present invention containing the predetermined amount of the first group element in which the average crystal grain diameter at the C cross-section falls within the specific range, generation of the unbonded region (void) can be reduced at the time of bonding, and the EBR in the initial bonding can be increased. Additionally, due to the tensile strength falling within the range described above, development of a crack may be suppressed in the vicinity of the bonded part of the Al wiring material, so that it is estimated that the high-temperature reliability of the bonded part can be further improved. That is, it can be considered that, the unbonded region generated at the time of bonding is reduced as the Al wiring material contains the predetermined amount of the first group element and the average crystal grain diameter at the C cross-section falls within the specific range, and deformation of the Al wiring material or breakdown of the oxide film is accelerated to obtain favorable metallic junction with the electrode on the bonded interface as the tensile strength falls within the range described above, so that development of a crack is suppressed in the power cycle test.

In the Al wiring material of the present invention, the tensile strength is preferably falls within a range equal to or larger than 25 MPa and equal to or smaller than 95 MPa. When the tensile strength exceeds 95 MPa, the Al wiring material is hard, and an effect of suppressing development of a crack cannot be sufficiently obtained in the power cycle test. The tensile strength of the Al wiring material is preferably smaller than 95 MPa, equal to or smaller than 94 MPa, equal to or smaller than 92 MPa, equal to or smaller than 90 MPa, equal to or smaller than 88 MPa, or equal to or smaller than 86 MPa, and more preferably equal to or smaller than 85 MPa, equal to or smaller than 84 MPa, equal to or smaller than 82 MPa, or equal to or smaller than 80 MPa. On the other hand, when the tensile strength is smaller than 25 MPa, the Al wiring material is soft, and a manufacturing yield tends to be lowered as the wire diameter is reduced at the time of manufacturing the Al wiring material. The tensile strength of the Al wiring material is preferably equal to or larger than 26 MPa, or equal to or larger than 28 MPa, and more preferably equal to or larger than 30 MPa, equal to or larger than 32 MPa, equal to or larger than 34 MPa, equal to or larger than 36 MPa, equal to or larger than 38 MPa, or equal to or larger than 40 MPa. When the tensile strength of the Al wiring material is equal to or larger than 30 MPa and equal to or smaller than 85 MPa, an effect of further increasing the EBR is advantageously obtained.

Accordingly, in a preferred embodiment, the tensile strength of the Al wiring material is preferably equal to or larger than 25 MPa and equal to or smaller than 95 MPa, and more preferably equal to or larger than 30 MPa and equal to or smaller than 85 MPa.

—Mg, Mn, Cu (Second Group Element)—

The Al wiring material of the present invention may further contain one or more of Mg, Mn, and Cu.

Regarding the Al wiring material of the present invention containing the predetermined amount of the first group element in which the average crystal grain diameter at the C cross-section falls within the specific range, when the Al wiring material further contains one or more of Mg, Mn, and Cu (also referred to as a "second group element"), the high-temperature reliability of the bonded part can be further improved. For example, when the Al wiring material of the present invention further contains the second group element, the number of cycles until a fault is caused may be increased 1.5 times or more in the power cycle test.

When the number of cycles in the power cycle test is increased, recovery and recrystallization proceed inside the Al wiring material and the structure is changed due to an effect similar to an effect of increasing a heating time, so that a crack is enabled to easily develop. On the other hand, it can be considered that, progress of recovery and recrystallization can be delayed when the Al wiring material contains the predetermined amount of the second group element, and also due to the effect of improving the EBR due to containing of the first group element and control of the crystal grain diameter, the number of cycles until a fault is caused can be increased in the power cycle test. From this viewpoint, it has been confirmed that it is difficult to obtain the effect of improving the high-temperature reliability of the bonded part by adding only the second group element. Regarding the Al wiring material of the present invention containing the predetermined amount of the first group element in which the average crystal grain diameter at the C cross-section falls within the specific range, when the Al wiring material further contains the predetermined amount of the second group element, a synergistic effect of further improving the high-temperature reliability of the bonded part can be achieved.

Regarding the Al wiring material of the present invention, $200 \leq x2 \leq 6000$ is preferably satisfied where x2 is a total content of the second group element [mass ppm]. When the total content of the second group element, that is, x2, is smaller than 200 mass ppm, the effect of further improving the high-temperature reliability of the bonded part cannot be sufficiently obtained. x2 is preferably equal to or larger than 220 mass ppm, equal to or larger than 240 mass ppm, equal to or larger than 250 mass ppm, equal to or larger than 260 mass ppm, or equal to or larger than 280 mass ppm, and more preferably equal to or larger than 300 mass ppm, equal to or larger than 320 mass ppm, equal to or larger than 340 mass ppm, equal to or larger than 360 mass ppm, equal to or larger than 380 mass ppm, or equal to or larger than 400 mass ppm. On the other hand, when x2 exceeds 6000 mass ppm, a chip damage tends to be easily caused at the time of bonding of the Al wiring material. x2 is preferably equal to or smaller than 5800 mass ppm, equal to or smaller than 5600 mass ppm, equal to or smaller than 5400 mass ppm, or equal to or smaller than 5200 mass ppm, and more preferably equal to or smaller than 5000 mass ppm, equal to or smaller than 4800 mass ppm, equal to or smaller than 4600 mass ppm, equal to or smaller than 4400 mass ppm, equal to or smaller than 4200 mass ppm, or equal to or smaller than 4000 mass ppm. When x2 is equal to or larger than 300 mass ppm and equal to or smaller than 5000 mass ppm, it is advantageous because the high-temperature reliability of the bonded part can be particularly improved.

Accordingly, in a preferred embodiment, the total content x2 [mass ppm] of the second group element in the Al wiring material preferably satisfies $200 \leq x2 \leq 6000$, and more preferably satisfies $300 \leq x2 \leq 5000$.

—Fe, Si, Ni (Third Group Element)—

The Al wiring material of the present invention may further contain one or more of Fe, Si, and Ni.

Regarding the Al wiring material of the present invention containing the predetermined amount of the first group element in which the average crystal grain diameter at the C cross-section falls within the specific range, when the Al wiring material further contains one or more of Fe, Si, and Ni (also referred to as a "third group element"), the high-temperature reliability of the bonded part can be further improved in a case in which the Al wiring material has a smaller diameter. When the Al wiring material contains the third group element, productivity can be improved at a high-speed wire-drawing step in manufacturing the Al wiring material, and mass production adaptability can be enhanced. The Al wiring material that may further obtain the effect described above due to containing of the third group element preferably has the wire diameter equal to or smaller than 200 μm, and obtains a higher effect in a case in which the wire diameter is equal to or smaller than 120 μm.

When the Al wiring material has a smaller diameter, deformation of the Al wiring material easily proceeds at an early stage due to a load at the time of bonding, stress concentration is caused at a neck part corresponding to a bonded end part, and a crack from the neck part tends to be developed. On the other hand, when the Al wiring material contains the third group element, it can be considered that the high-temperature reliability of the bonded part is improved due to an effect of reducing stress concentration or reducing deformation of the neck part even in a case in which the Al wiring material has a small diameter. From this viewpoint, it has been confirmed that the effect of further improving the high-temperature reliability of the bonded part cannot be sufficiently obtained by adding only the third group element. With the Al wiring material of the present invention containing the predetermined amount of the first group element in which the average crystal grain diameter at the C cross-section falls within the specific range, bonding at the neck part (where bonding is naturally difficult to be performed) is accelerated as the unbonded region is reduced on the bonded interface, and a synergistic effect of further improving the high-temperature reliability of the bonded part is achieved as the Al wiring material further contains the third group element.

Regarding the Al wiring material of the present invention, $10 \leq x3 \leq 2000$ is preferably satisfied where x3 is a total content of the third group element [mass ppm]. When the total content of the third group element, that is, x3, is smaller than 10 mass ppm, the effect of further improving the high-temperature reliability of the bonded part cannot be sufficiently obtained in a case in which the Al wiring material has a small diameter. x3 is preferably equal to or larger than 12 mass ppm, equal to or larger than 14 mass ppm, equal to or larger than 16 mass ppm, or equal to or larger than 18 mass ppm, and more preferably equal to or larger than 20 mass ppm, equal to or larger than 22 mass ppm, equal to or larger than 24 mass ppm, equal to or larger than 26 mass ppm, equal to or larger than 28 mass ppm, or equal to or larger than 30 mass ppm. On the other hand, when x3 exceeds 2000 mass ppm, the effect of improving productivity at the high-speed wire-drawing step tends not be sufficiently obtained. x3 is preferably equal to or smaller than 1800 mass ppm, or equal to or smaller than 1600 mass ppm, and more preferably equal to or smaller than 1500 mass ppm, equal to or smaller than 1400 mass ppm, equal to or smaller than 1200 mass ppm, or equal to or smaller than 1000 mass ppm. When x3 is equal to or larger than 20 mass ppm and equal to or smaller than 1500 mass ppm, especially when x3 is equal to or larger than 20 mass ppm and equal to or smaller than 1000 mass ppm, it is advantageous because the high-temperature reliability of the bonded part can be further improved in a case in which the Al wiring material has a small diameter.

Accordingly, in a preferred embodiment, the total content x3 [mass ppm] of the third group element in the Al wiring material preferably satisfies $10 \leq x3 \leq 2000$, more preferably satisfies $20 \leq x3 \leq 1500$, and even more preferably satisfies $20 \leq x3 \leq 1000$.

<<Evaluation of High-Temperature Reliability>>

In the present invention, the high-temperature reliability of the bonded part is evaluated by the power cycle test. The power cycle test is a test in which rapid heating and cooling are repeatedly performed for the semiconductor device to which the Al wiring material is bonded. Heating is performed for 2 seconds until the temperature of the bonded part of the Al wiring material in the semiconductor device reaches 140° C., and cooling is performed for 25 seconds until the temperature of the bonded part drops to 30° C. This heating/cooling cycle is repeated 50000 times or 100000 times.

After the power cycle test described above, the shear force of the bonded part at a first connection part with respect to the electrode on the semiconductor chip is measured, and the high-temperature reliability is evaluated. With the Al wiring material of the present invention containing the predetermined amount of the first group element in which the average crystal grain diameter at the C cross-section falls within the specific range, the bonded part exhibits a favorable shear force even in a case of repeating the cycle described above 50000 times or 100000 times, and excellent high-temperature reliability can be achieved.

The balance, the remaining part, of the Al wiring material according to the present invention contains Al. As an aluminum raw material for manufacturing the Al wiring material, Al having a purity of 4N (Al: 99.99% by mass or more) can be used. More preferably, Al having a purity equal to or higher than 5N (Al: 99.999% by mass or more) is used. In a range of not inhibiting the effect of the present invention, the balance of the Al wiring material according to the present invention may contain an element other than Al. The content of Al in the Al wiring material of the present invention is not limited so long as the content does not inhibit the effect of the present invention, preferably equal to or larger than 95% by mass, equal to or larger than 96% by mass, or equal to or larger than 97% by mass, and more preferably equal to or larger than 98% by mass, equal to or larger than 98.5% by mass, equal to or larger than 98.6% by mass, equal to or larger than 98.8% by mass, or equal to or larger than 99% by mass. According to a preferred embodiment, the balance of the Al wiring material of the present invention consists of Al and inevitable impurities.

The Al wiring material of the present invention may have a coating that contains an element other than Al as a main component on an outer periphery of the Al wiring material, or does not necessarily have the coating. In a preferred embodiment, the Al wiring material of the present invention does not have a coating that contains a metal other than Al as a main component on the outer periphery of the Al wiring material. Herein, the "coating that contains a metal other than Al as a main component" means the coating in which the content of the metal other than Al is 50% by mass or more.

The Al wiring material of the present invention can implement the bonded part having favorable high-temperature reliability. Therefore, the Al wiring material of the present invention can be used in wide applications that require the high-temperature reliability at the time of connection to a member to be connected. For example, the Al wiring material can be suitably used for connection to a member to be connected in industrial devices such as a conveying device and a robot (Al wiring material for industrial devices). The Al wiring material can be suitably used for connection to a member to be connected in various semiconductor devices including a power semiconductor device (Al wiring material for semiconductor devices).

The Al wiring material of the present invention may have an arbitrary size depending on a specific aspect of use. In a case where the Al wiring material of the present invention is an Al wire used for industrial devices such as a conveying device and a robot, the diameter of the Al wire is not particularly limited, and it may be 500 μm to 10 mm, for example. The Al wiring material may be a stranded wire formed from a plurality of Al wires. In a case where the Al wiring material is an Al strip, the dimensions (w×t) of a rectangular or substantially rectangular cross-section thereof are not particularly limited, and w may be 500 μm to 10 mm, and t may be 50 μm to 2 mm, for example. In a case where the Al wiring material of the present invention is an Al bonding wire used for various semiconductor devices including a power semiconductor device, the diameter of the Al bonding wire is not particularly limited and may be 50 to 600 μm, for example. In a case where the Al wiring material is an Al bonding ribbon, the dimensions (w×t) of a rectangular or substantially rectangular cross-section thereof are not particularly limited, and w may be 100 to 3000 μm, and t may be 50 to 600 μm, for example.

(Method for Manufacturing Al Wiring Material)

A manufacturing method for the Al wiring material of the present invention is not particularly limited. For example, the Al wiring material of the present invention may be manufactured by using a known processing method such as extrusion processing, swaging processing, wire-drawing processing, and rolling processing, for example. When the wire diameter becomes small to some extent, it is preferable that wire-drawing processing with diamond dies be performed. With regard to the cold working in which the wire-drawing is performed at an ordinary temperature, a production device and the like therefor have a relatively simple configuration and a workability thereof is excellent. When the resistance during wire-drawing is decreased so as to increase the productivity, there may be used the hot working in which the wire-drawing is performed while heating.

After weighing pure metals of Al and additive elements as starting materials so that the content of each additive element falls within a specific range, these materials are mixed and then molten and solidified to form an ingot. Alternatively, as the raw material for each additive element, a mother alloy containing the additive element in high concentration may be used. In the process of melting for producing the ingot, a batch process or a continuous casting process can be used. The continuous casting process has an excellent productivity, while the batch process is easy to change a cooling temperature condition for solidification. The Al wiring material can be formed by processing the ingot to have final dimensions.

To adjust the average crystal grain diameter at the C cross-section of the Al wiring material to fall within a range from 3 to 35 μm, it is effective to use intermediate heat treatment in the middle of wire-drawing. In a case of performing the heat treatment on a thick wire having a wire diameter of 1 mm or more by a batch process, the intermediate heat treatment may be performed, for example, by heating at a temperature range of 200 to 500° C. for 0.2 minutes to 1 hour. Specific examples of the conditions may include heating at 250° C. for 30 minutes, heating at 350° C. for 1 minute, and the like. Alternatively, in a case of continuously performing the heat treatment with a relatively small diameter, that is, the wire diameter in a range from 500 μm to 2000 μm, for example, heating may be performed at a temperature range from 300 to 600° C. for 0.5 seconds to 3 seconds. In order to optimize the conditions more precisely, the temperature, the time, and the like can be easily optimized referring to the above heat treatment conditions. For example, when wiring materials subjected to an isothermal heat treatment under several time conditions are prototyped and average crystal grain diameters at C cross-sections thereof are measured, desired properties can be easily obtained.

To adjust the tensile strength of the Al wiring material to fall within a range equal to or larger than 25 MPa and equal to or smaller than 95 MPa, it is effective to perform thermal refining heat treatment at a high temperature or for a long time with the final wire diameter and a wire diameter in the vicinity thereof to reduce a strain amount introduced into the material by wire-drawing processing. Examples of conditions for the thermal refining heat treatment include heating at a relatively high temperature range from 450 to 620° C. for 0.1 seconds to 5 minutes. Specific examples of the conditions include heating at 580° C. for 0.2 seconds, or heating at 450° C. for 5 seconds, and the like. As a temperature condition for the thermal refining heat treatment, for example, after checking the tensile strength of the Al wiring material that is tempered by changing only a furnace temperature with a fixed wire feed speed, a heat treatment temperature may be determined so that a desired tensile strength can be obtained. The tensile strength can be easily controlled by adjusting the conditions for the thermal refining heat treatment in combination with the intermediate heat treatment.

To adjust the orientation ratio of the <111> crystal orientation to fall within a range from 0.5 to 35% at the C cross-section of the Al wiring material, it is effective to appropriately control a processed texture formed by wire-drawing processing, recovery of dislocation in the intermediate heat treatment, and growth of recrystallized grains. For example, it is effective to cause an average value of a reduction of area of a wire-drawing die to fall within a range from 5 to 15% with a wire diameter in a range from 500 μm to 3000 μm, or perform heating at a temperature range from 300 to 600° C. for 0.5 seconds to 3 seconds with a wire diameter in a range from 500 μm to 2000 μm as conditions for the intermediate heat treatment. It is also effective to perform the thermal refining heat treatment with the final wire diameter or a wire diameter in the vicinity thereof by heating at a temperature range from 400 to 600° C. for 0.1 seconds to 3 minutes. Specific examples of the thermal refining heat treatment condition may include heating at 550° C. for 0.4 seconds, heating at 400° C. for 5 seconds, or the like.

[Semiconductor Device]

The semiconductor device can be manufactured by connecting the electrode on the semiconductor chip to the lead frame or the external electrode on the substrate by using the Al wiring material of the present invention.

In one embodiment, the semiconductor device of the present invention includes the circuit board, the semiconductor chip, and the Al wiring material for bringing the circuit board and the semiconductor chip into conduction with each other, and is characterized in that the Al wiring material is the Al wiring material of the present invention.

In the semiconductor device of the present invention, the circuit board and the semiconductor chip are not particularly limited, and a known circuit board and semiconductor chip that may be used for constituting the semiconductor device may be used. Alternatively, a lead frame may be used in place of the circuit board. For example, like the semiconductor device disclosed in Japanese Patent Application Laid-open No. 2002-246542, the semiconductor device may include a lead frame and a semiconductor chip mounted on the lead frame.

Examples of the semiconductor device include various semiconductor devices used for electric products (for example, a computer, a cellular telephone, a digital camera, a television, an air conditioner, a solar power generation system), vehicles (for example, a motorcycle, an automobile, an electric train, a ship, and an aircraft), and the like, and a semiconductor device for electric power (power semiconductor device) is especially preferred.

Examples

Hereinafter, the present invention will be described in detail with reference to Examples. However, the present invention is not limited to the following Examples.

(Sample)

A method for producing a sample will be described. As a raw material, Al having a purity of 5N (99.9999% by mass or more) and including inevitable impurities as a balance was used. Pd, Pt, Mg, Mn, Cu, Fe, Si, and Ni used as alloy elements each having a purity of 99.9% by mass or more and including inevitable impurities as a balance were also used. These materials were melted as raw materials and an Al ingot having compositions indicated in Table 1 was obtained. The ingot was then subjected to an extrusion process, a swaging process, followed by a wire-drawing process. Regarding the area reduction ratio of the wire-drawing die used with the wire diameter in a range from 500 μm to 2000 μm, an average value fell within a range from 5 to 15%. With the wire diameter in a range from 1 mm to 2 mm, the intermediate heat treatment was performed under heating conditions of heating at temperature range from 400 to 600° C. for 1 second to 3 seconds. Thereafter, die wire-drawing processing was performed assuming that the final wire diameter was 100, 300, and 500 μm. After the wire-drawing processing ended, thermal refining heat treatment was performed under conditions of heating at a temperature range from 450 to 600° C. for 0.2 seconds to 3 seconds, and the Al wiring material was obtained.

[Measurement of Element Content]

The content of additive elements in the Al wiring material was measured by using ICP-OES ("PS3520UVDDII" manufactured by Hitachi High-Tech Corporation) or ICP-MS ("Agilent 7700x ICP-MS" manufactured by Agilent Technologies, Inc.) as an analysis device.

[Measurement of Average Crystal Grain Diameter at C Cross-Section]

The average crystal grain diameter was measured by using the C cross-section of the Al wiring material as a measurement surface. The EBSD method was used for the measurement. Specifically, an area of each crystal grain was measured for the entire C cross-section, a circle equivalent diameter was obtained based on the area of each crystal grain, and the circle equivalent diameters were arithmetically averaged to obtain the average crystal grain diameter. Measurement surfaces (C cross-sections) at five points were selected at intervals of 1 m or more with respect to the longitudinal direction of the Al wiring material, and obtained respective values of average crystal grain diameters were arithmetically averaged to be the average crystal grain diameter at the C cross-section.

[Measurement of Orientation Ratio of <111> Crystal Orientation at C Cross-Section]

The orientation ratio of the <111> crystal orientation was measured by using the C cross-section of the Al wiring material as a measurement surface. The EBSD method was used for the measurement, and the orientation ratio of the <111> crystal orientation was calculated by using analysis software attached to the device through the procedure described above. Measurement surfaces (C cross-sections) at five points were selected at intervals of 1 m or more with respect to the longitudinal direction of the Al wiring material, and obtained respective values of orientation ratios were arithmetically averaged to be the orientation ratio of the <111> crystal orientation at the C cross-section.

[Measurement of Tensile Strength]

The tensile strength of the Al wiring material was measured by performing a tensile test for the Al wiring material, and a maximum stress in the tensile test was assumed to be the tensile strength. The tensile strength was measured with a tensile tester manufactured by Instron under conditions of a distance between gauge points of 100 mm, a tensile speed of 10 mm/min, and a load cell rating load of 1 kN. Measurement was performed five times, and obtained respective values of tensile strengths were arithmetically averaged to be the tensile strength of the Al wiring material.

<Connection>

In the semiconductor device, the electrode on the semiconductor chip was an Al—Cu pad (thickness: 2 μm), and an Ni-coated Cu lead frame was used for an external terminal. A first connection part between the electrode on the semiconductor chip and the Al wiring material, and a second connection part between the external terminal and the Al wiring material were both wedge-bonded. As acceleration evaluation for simulating sample heating in a normal reliability test, aging heat treatment was performed at 300° C. for 30 minutes after the connection.

<Evaluation of Bondability>

—Effective Bonding Area Ratio (EBR)—

The following describes calculation of the EBR at the bonded part of the Al wiring material. The EBR was obtained by evaluating the Al wiring materials having wire diameters of 300 μm and 500 μm and obtaining a ratio of the area M2 in which metallic junction is obtained to the area M1 of the bonded interface of the first connection part (M2/M1). Specifically, the shear test for the bonded part was performed, and a broken electrode to be bonded was observed with an optical microscope or an SEM. The area M1 of the bonded interface and the area M3 of the unbonded region were then measured by image analysis, the unbonded region in which it was determined that the electrode was deformed but metallic junction was not obtained at the time of bonding, and the area M2 (=M1−M3) in which metallic junction was obtained was calculated. By using the obtained areas M1 and M2, the EBR was calculated as the ratio of M2 to M1 (M2/M1). Specifically, a computational expression thereof is EBR=M2/M1=(M1−M3)/M1. Observation was performed on bonded parts at 20 points, and obtained values of EBR were arithmetically averaged to obtain the effective bonding area ratio (EBR). In the "EBR" column of Table 1, a case in which the value of EBR was equal to or larger than 0.9 was marked with a symbol of "double circle" since excellent bonding was obtained, a case in which the value of EBR was equal to or larger than 0.8 and smaller than 0.9 was marked with a symbol of "circle" since bonding was favorable, a case in which the value of EBR was equal to or larger than 0.7 and smaller than 0.8 was marked with a symbol of "square" since there was no practical problem, a case in which the value of EBR was equal to or larger than 0.6 and smaller than 0.7 was marked with a symbol of "triangle" since the bonding had no problem for normal use, but it was necessary to pay attention, and a case in which the value of EBR was smaller than 0.6 was marked with a symbol of "cross" since the bondability was inferior.

—Evaluation of Chip Damage—

A chip damage in the semiconductor device was evaluated by dissolving metal on a pad surface by acid, and observing a part under the pad by a microscope (the number of evaluations N=50). In the "chip damage" column of Table 1, a case in which a crack, traces of bonding, and the like were not found was determined to be favorable to be marked with a symbol of "circle", a case in which there was no crack but traces of bonding were found at some spots (three spots or less of the number of evaluations 50) was marked with a symbol of "triangle", and the other cases were marked with a symbol of "cross".

<Evaluation of High-Temperature Reliability of Bonded Part>

The high-temperature reliability of the bonded part was evaluated by performing the power cycle test for the Al wiring materials having wire diameters of 300 μm and 100 μm. In the power cycle test, heating and cooling were alternately and repeatedly performed for the semiconductor device in which the Al wiring material was connected. Heating was performed for 2 seconds until the maximum temperature reached about 140° C., and cooling was performed for 25 seconds until the temperature of the bonded part dropped to 30° C. thereafter. The Al wiring material having the wire diameter of 300 μm was evaluated for both of a case in which the heating/cooling cycle was repeated 50000 times and a case in which the heating/cooling cycle was repeated 100000 times. The Al wiring material having the wire diameter of 100 μm was evaluated for a case in which the heating/cooling cycle was repeated 50000 times and a case in which the heating/cooling cycle was repeated 100000 times.

After the power cycle test described above, the shear force of the bonded part at the first connection part was measured, and the high-temperature reliability of the bonded part was evaluated. The high-temperature reliability was evaluated by a ratio S2/S1 where a shear force of the bonded part in initial bonding was S1 and a shear force after the power cycle test was S2. In the "High-temperature reliability" column of Table 1, a case in which the value of S2/S1 was equal to or larger than 0.9 was marked with a symbol of "double circle" since the reliability was excellent, a case in which the value of S2/S1 was equal to or larger than 0.8 and smaller than 0.9 was marked with a symbol of "circle" since the reliability was favorable, a case in which the value of S2/S1 was equal to or larger than 0.7 and smaller than 0.8 was marked with a symbol of "square" since there was no practical problem, a case in which the value of S2/S1 was equal to or larger than 0.6 and smaller than 0.7 was marked with a symbol of "triangle" since the reliability had no problem for normal use, but it was necessary to pay attention, and a case in which the value of S2/S1 was smaller than 0.6 was marked with a symbol of "cross" since the high-temperature reliability was inferior.

The evaluation results of Examples and Comparative Examples are indicated in Table 1.

TABLE 1

| | | First group element (mass ppm) | | | Second group element (mass ppm) | | | | Third group element (mass ppm) | | | | Average crystal grain diameter |
|---|---|---|---|---|---|---|---|---|---|---|---|---|---|
| | No. | Pd | Pt | Total | Mg | Mn | Cu | Total | Fe | Si | Ni | Total | (μm) |
| Example | 1 | 3 | | 3 | | | | | | | | | 8.5 |
| | 2 | 6 | | 6 | | | | | | 15 | | 15 | 34.8 |
| | 3 | 15 | | 15 | | | | | | | | | 25.3 |
| | 4 | 30 | | 30 | | | | | | | 8 | 8 | 11.4 |
| | 5 | 70 | | 70 | | | | | 60 | | 10 | 70 | 3.5 |
| | 6 | 40 | | 40 | 200 | | | 200 | | | | | 22.0 |
| | 7 | 50 | | 50 | 500 | | 1500 | 2000 | | | | | 11.4 |
| | 8 | 70 | | 70 | 4000 | | 2000 | 6000 | | | | | 4.5 |
| | 9 | 20 | | 20 | | 1500 | | 1500 | 20 | | 20 | 40 | 11.6 |
| | 10 | 80 | | 80 | 2000 | | 1000 | 3000 | | 800 | | 800 | 7.4 |
| | 11 | 85 | | 85 | | | | | | | | | 7.3 |
| | 12 | 90 | | 90 | | | | | | | | | 3.0 |
| | 13 | | 10 | 10 | | | | | | | 20 | 20 | 13.2 |
| | 14 | | 30 | 30 | | | | | 300 | | | 300 | 6.2 |
| | 15 | | 50 | 50 | | | | | | | | | 16.7 |
| | 16 | | 70 | 70 | | | | | 150 | 200 | | 350 | 4.8 |
| | 17 | | 40 | 40 | 300 | | | 300 | | | | | 17.5 |
| | 18 | | 50 | 50 | 500 | | 1500 | 2000 | | | | | 12.2 |
| | 19 | | 60 | 60 | | 1000 | 800 | 1800 | | | | | 11.5 |
| | 20 | | 100 | 100 | | 1500 | 2000 | 3500 | 20 | | 20 | 40 | 7.7 |
| | 21 | | 30 | 30 | 2000 | 2000 | 2200 | 6200 | | 1500 | | 1500 | 8.3 |
| | 22 | | 200 | 200 | | | | | | | | | 7.3 |
| | 23 | | 250 | 250 | | | | | | 120 | | 120 | 6.2 |
| | 24 | 10 | 10 | 20 | | | | | | | 50 | 50 | 18.8 |
| | 25 | 20 | 20 | 40 | 2000 | | 1000 | 3000 | 100 | 200 | | 300 | 9.5 |
| | 26 | 40 | 30 | 70 | | | | | | | | | 22.3 |
| | 27 | 50 | 40 | 90 | 800 | 500 | | 1300 | 1000 | 1200 | 30 | 2230 | 4.1 |
| | 28 | 85 | 80 | 165 | 1000 | 1000 | | 2000 | | 200 | | 200 | 8.3 |
| | 29 | 40 | 70 | 110 | | | | | | | 100 | 100 | 7.7 |
| | 30 | 70 | 180 | 250 | | 2000 | 800 | 2800 | 200 | | | 200 | 5.3 |
| Comparative | 1 | | | | | | | | | | | | 15.2 |
| Example | 2 | 2 | | 2 | | | | | | | | | 19.3 |
| | 3 | | 8 | 8 | | | | | | | | | 17.7 |

TABLE 1-continued

| | | | | | |
|---|---|---|---|---|---|
| 4 | 92 | | 92 | | 5.1 |
| 5 | 80 | 230 | 310 | | 4.6 |
| 6 | 70 | 30 | 100 | | 2.8 |
| 7 | 20 | 20 | 40 | | 35.5 |

| | | | | | | High-temperature reliability | | | |
|---|---|---|---|---|---|---|---|---|---|
| | | Tensile | Orientation ratio | EBR | | 300 μm | | 100 μm | |
| | No. | strength (MPa) | of <111> crystal orientation (%)*[1] | 300 μm | 500 μm | 50000 times | 100000 times | 50000 times | Chip damage |
| Example | 1 | 45 | 5 | ○ | ○ | ○ | ○ | Δ | ○ |
| | 2 | 25 | 0.6 | ◎ | ○ | ○ | □ | ○ | ○ |
| | 3 | 33 | 8 | ◎ | ◎ | ◎ | ○ | □ | ○ |
| | 4 | 45 | 4 | ◎ | ◎ | ◎ | ○ | ○ | ○ |
| | 5 | 73 | 7 | ◎ | ◎ | ◎ | ○ | ◎ | ○ |
| | 6 | 43 | 10 | ◎ | ◎ | ◎ | ○ | ○ | ○ |
| | 7 | 61 | 18 | ◎ | ◎ | ◎ | ◎ | ○ | ○ |
| | 8 | 88 | 30 | ◎ | ◎ | ○ | ○ | □ | ○ |
| | 9 | 48 | 15 | ◎ | ◎ | ◎ | ◎ | ◎ | ○ |
| | 10 | 62 | 33 | ◎ | ○ | ◎ | ◎ | ◎ | ○ |
| | 11 | 51 | 11 | ○ | ○ | ◎ | ○ | □ | ○ |
| | 12 | 95 | 25 | ○ | ○ | ○ | ○ | □ | ○ |
| | 13 | 23 | 8 | ○ | ○ | □ | Δ | Δ | ○ |
| | 14 | 35 | 15 | ◎ | ◎ | ◎ | ○ | Δ | ○ |
| | 15 | 43 | 2 | ◎ | ○ | ◎ | ○ | ○ | ○ |
| | 16 | 85 | 11 | ◎ | ◎ | ○ | □ | □ | ○ |
| | 17 | 37 | 20 | ◎ | ◎ | ◎ | ◎ | ○ | ○ |
| | 18 | 48 | 25 | ◎ | ◎ | ◎ | ◎ | ○ | ○ |
| | 19 | 62 | 29 | ◎ | ◎ | ◎ | ◎ | ○ | ○ |
| | 20 | 79 | 26 | ◎ | ◎ | ◎ | ◎ | ◎ | ○ |
| | 21 | 97 | 34 | ◎ | ○ | □ | □ | □ | Δ |
| | 22 | 88 | 30 | ◎ | ◎ | ◎ | ○ | ○ | ○ |
| | 23 | 64 | 23 | ○ | ○ | ○ | ○ | ○ | ○ |
| | 24 | 30 | 3 | ◎ | ◎ | ◎ | ○ | ◎ | ○ |
| | 25 | 47 | 4 | ◎ | ◎ | ◎ | ◎ | ◎ | ○ |
| | 26 | 25 | 0.5 | ◎ | ○ | ◎ | ○ | ○ | ○ |
| | 27 | 90 | 37 | ◎ | □ | ○ | ○ | ○ | Δ |
| | 28 | 69 | 15 | ○ | ○ | ◎ | ◎ | ◎ | ○ |
| | 29 | 55 | 23 | ◎ | ◎ | ◎ | ○ | ◎ | ○ |
| | 30 | 75 | 26 | ◎ | ◎ | ○ | ○ | ○ | ○ |
| Comparative Example | 1 | 27 | 3 | X | X | X | X | X | ○ |
| | 2 | 30 | 5 | X | X | X | X | X | ○ |
| | 3 | 45 | 8 | X | X | X | X | X | ○ |
| | 4 | 75 | 14 | X | X | X | X | X | Δ |
| | 5 | 82 | 25 | X | X | X | X | X | Δ |
| | 6 | 90 | 30 | X | X | X | X | X | ○ |
| | 7 | 27 | 0.5 | X | X | X | X | X | ○ |

*[1]Orientation ratio of crystal orientation <111> angled at 15 degrees or less to longitudinal direction of Al wiring material on C cross-section of Al wiring material (%)

In all of the Al wiring materials in Examples No. 1 to 30, the contents of Pd and Pt and the average crystal grain diameter at the C cross-section fell within the range of the present invention, evaluation of the EBR (300 μm) was marked with a symbol of "circle" or "double circle", and the result of the high-temperature reliability was favorable.

In Examples No. 1 to 26, and 28 to 30, the orientation ratio of the <111> crystal orientation at the C cross-section fell within the preferred range, evaluation of the EBR (500 μm) was marked with a symbol of "circle" or "double circle", and the result of the high-temperature reliability was favorable.

In Examples No. 1 to 12, 14 to 20, and 22 to 30, the tensile strength fell within the preferred range, evaluation of the high-temperature reliability with the wire diameter of 300 μm and the number of cycles of 50000 was marked with a symbol of "circle" or "double circle", and the high-temperature reliability was more favorable.

In Comparative Examples No. 1 to 5, the contents of Pd and Pt were outside the range of the present invention, and in Comparative Examples No. 6 and 7, the average crystal grain diameter was outside the range of the present invention. Accordingly, evaluation of the EBR was marked with a symbol of "cross", and the high-temperature reliability was poor.

The invention claimed is:

1. An Al wiring material containing one or more of Pd and Pt so as to satisfy $$3 \le x1a \le 90 \text{ or } 10 \le x1b \le 250, \text{ and}$$

$$3 \le (x1a + x1b) \le 300,$$

where x1a and x1b are respectively a content of Pd in mass ppm and a content of Pt in mass ppm, with a balance comprising Al, an average crystal grain diameter on a cross-section perpendicular to a longitudinal direction of the Al wiring material is 3 to 35 μm, and on the cross-section perpendicular to the longitudinal direction of the Al wiring material, an orientation ratio of a crystal orientation <111> angled at 15 degrees or less to the longitudinal direction of the Al wiring material is equal to or higher than 0.5% and equal to or lower than 35%.

2. The Al wiring material according to claim 1, wherein a tensile strength is equal to or larger than 25 MPa and equal to or smaller than 95 MPa.

3. The Al wiring material according to claim 1, further containing one or more of Mg, Mn, and Cu so as to satisfy $$200 \leq x2 \leq 6000$$

where x2 is a total content thereof in mass ppm.

4. The Al wiring material according to claim 1, further containing one or more of Fe, Si, and Ni so as to satisfy $$10 \leq x3 \leq 2000$$

where x3 is a total content thereof in mass ppm.

5. The Al wiring material according to claim 1, wherein a content of Al is equal to or larger than 98% by mass.

6. The Al wiring material according to claim 1, wherein the balance of the Al bonding wire comprises Al and inevitable impurities.

7. A semiconductor device comprising the Al wiring material according to claim 1.

* * * * *